United States Patent
Ranish et al.

(10) Patent No.: US 10,020,204 B2
(45) Date of Patent: Jul. 10, 2018

(54) BOTTOM PROCESSING

(71) Applicant: Applied Materials, Inc., Santa Clara, CA (US)

(72) Inventors: Joseph M. Ranish, San Jose, CA (US); Aaron Muir Hunter, Santa Cruz, CA (US); Swaminathan T. Srinivasan, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/456,009

(22) Filed: Mar. 10, 2017

(65) Prior Publication Data

US 2017/0263466 A1    Sep. 14, 2017

Related U.S. Application Data

(60) Provisional application No. 62/306,150, filed on Mar. 10, 2016.

(51) Int. Cl.
*H01L 21/302* (2006.01)
*H01L 21/461* (2006.01)
(Continued)

(52) U.S. Cl.
CPC ........ *H01L 21/324* (2013.01); *H01L 21/2251* (2013.01); *H01L 21/30604* (2013.01); *H01L 21/31155* (2013.01); *H01L 21/67115* (2013.01); *H01L 21/67167* (2013.01); *H01L 21/67196* (2013.01); *H01L 21/67207* (2013.01); *H01L 21/67225* (2013.01); *H01L 21/68* (2013.01); *H01L 21/68735* (2013.01); *Y10S 148/042* (2013.01); *Y10S 438/924* (2013.01)

(58) Field of Classification Search
None
See application file for complete search history.

(56) References Cited

U.S. PATENT DOCUMENTS

| 8,249,436 B2 | 8/2012 | Aderhold et al. |
| 2008/0128019 A1* | 6/2008 | Lopatin ............... C25D 5/022 136/252 |

(Continued)

FOREIGN PATENT DOCUMENTS

JP    2003017723 A * 1/2003    ......... H01L 31/1804

*Primary Examiner* — Stephanie P Duclair
(74) *Attorney, Agent, or Firm* — Patterson + Sheridan LLP (57) ABSTRACT

Embodiments disclosed herein generally relate to methods and apparatus for processing of the bottom surface of a substrate to counteract thermal stresses thereon. Correcting strains are applied to the bottom surface of the substrate which compensate for undesirable strains and distortions on the top surface of the substrate. Specifically designed films may be formed on the back side of the substrate by any combination of deposition, implant, thermal treatment, and etching to create strains that compensate for unwanted distortions of the substrate. In some embodiments, localized strains may be introduced by locally altering the hydrogen content of a silicon nitride film or a carbon film, among other techniques. Structures may be formed by printing, lithography, or self-assembly techniques. Treatment of the layers of film is determined by the stress map desired and includes annealing, implanting, melting, or other thermal treatments.

20 Claims, 7 Drawing Sheets (51) Int. Cl.
*B44C 1/22* (2006.01)
*C03C 15/00* (2006.01)
*C23F 1/00* (2006.01)
*H01L 21/324* (2006.01)
*H01L 21/3115* (2006.01)
*H01L 21/225* (2006.01)
*H01L 21/306* (2006.01)
*H01L 21/68* (2006.01)
*H01L 21/67* (2006.01)
*H01L 21/687* (2006.01)

(56) References Cited

U.S. PATENT DOCUMENTS

| | | | |
|---|---|---|---|
| 2008/0283726 A1* | 11/2008 | Uya | H01L 27/14603 250/208.1 |
| 2011/0065274 A1* | 3/2011 | Cahalen | C23C 18/1605 438/655 |
| 2011/0124146 A1* | 5/2011 | Pitera | H01L 31/0687 438/64 |
| 2015/0325558 A1* | 11/2015 | Hikasa | H01L 29/16 257/49 |

* cited by examiner

BOTTOM PROCESSING

CROSS-REFERENCE TO RELATED APPLICATIONS

This application claims benefit of U.S. Provisional Patent Application No. 62/306,150, filed Mar. 10, 2016, the entirety of which is herein incorporated by reference.

FIELD

Embodiments of the present disclosure generally relate to methods and apparatus for semiconductor processing. More specifically, embodiments described herein relate to methods and apparatus for processing a bottom side of a substrate.

BACKGROUND

During chip manufacturing, substrates experience non-uniform localized distortions which, if uncorrected, cause misalignments of lithography patterns between layers. The registration may be corrected for certain types of distortions in that the pattern can be optically matched during the lithography print. For other types of distortions, however, correction is not possible and a yield loss results. Furthermore, as feature sizes continue to shrink, the tolerance to distortions decreases and the number of uncorrectable distortions increases.

Distortions have previously been corrected for via the local implantation of controlled amounts of ions into the hardmask to create local strains. The local strains compensate the previously existing ones. However, contamination of the underlying layers by the chosen ion is possible.

Other attempts to correct for distortions involve variable local surface annealing of the hardmask to create local strains which compensate the previously existing ones. One the other hand, however, partial relaxation occurs as the surface of the hardmask is removed during subsequent processing.

Therefore, what is needed in the art is a method and apparatus for treating the backside of a substrate.

SUMMARY

In one embodiment, a method for treating a backside of a substrate is disclosed. The method includes depositing a film on the backside of the substrate, annealing the substrate, and implanting on the backside of the substrate. The method further includes thermally treating the backside of the substrate.

In another embodiment, a method for treating a backside of a substrate is disclosed. The method includes annealing the substrate, implanting the backside of the substrate, and thermally treating the backside of the substrate. The method further includes etching the backside of the substrate, and aligning the substrate for patterning.

In yet another embodiment, a tool for processing a substrate is disclosed. The tool includes a process chamber for depositing a plurality of film layers on a backside of the substrate. The process chamber includes a transfer chamber, a deposition tool, an annealing tool, and an etching tool. The annealing tool anneals the plurality of film layers on the backside of the substrate and includes a substrate edge support. The etching tool etches the backside of the substrate and includes a substrate edge support.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally relate to methods and apparatus for processing of the bottom surface of a substrate to counteract thermal stresses thereon. Correcting strains are applied to the bottom surface of the substrate which compensate for undesirable strains and distortions on the top surface of the substrate. Specifically designed films may be formed on the back side of the substrate by any combination of deposition, implant, thermal treatment, and etching to create strains that compensate for unwanted distortions of the substrate. In some embodiments, localized strains may be introduced by locally altering the hydrogen content of a silicon nitride film or a carbon film, among other techniques. Structures may be formed by printing, lithography, or self-assembly techniques. Treatment of the layers of film is determined by the stress map desired and includes annealing, implanting, melting, or other thermal treatments.

As utilized herein a substrate is any suitable substrate, such as a single crystal silicon substrate; silicon on insulator (SOI); Silicon Germanium or alloys thereof, glass or quartz substrate with a silicon layer thereon, as used for manufacturing thin film transistors (TFT); or the like. The substrate may have devices and structures formed on a device side of the substrate.

Figure 1:
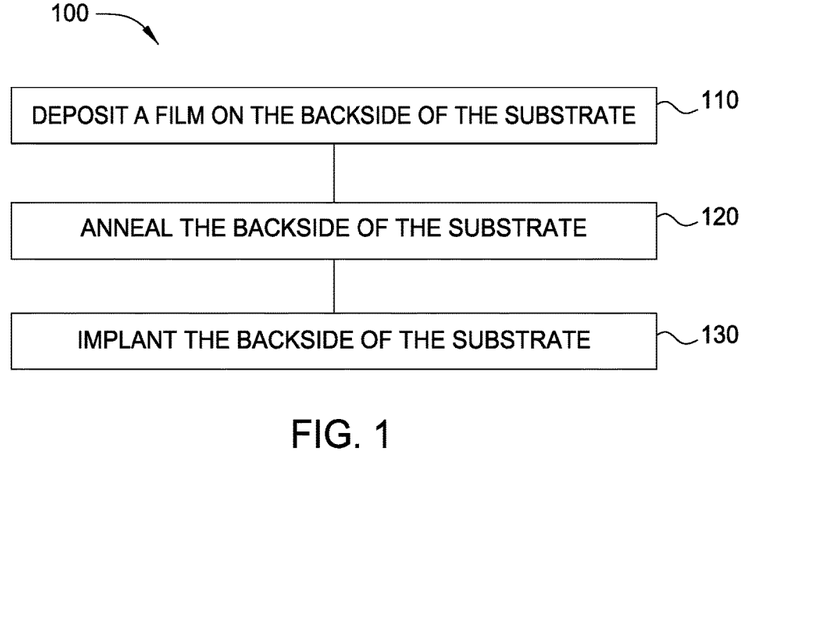
FIG. 1 schematically illustrates operations of a method for treating a backside of a substrate, according to one embodiment.

FIG. 1 illustrates operations of a method 100 for treating a backside of a substrate to compensate for strains on the front side of the substrate.

At operation 110, a film is deposited on the backside of the substrate. The deposition may be completed utilizing any PRODUCER® series chamber commercially available from Applied Materials, Inc. located in Santa Clara, Calif. In some embodiments, the film may be a blanket film deposited on the backside of the substrate. The film may be, or include, an amorphous carbon film, a silicon oxide film, or a silicon nitride film.

An area of the film is deposited to a corresponding area of the substrate. The film may be deposited on a backside of the substrate. In certain embodiments, the area of the film corresponds to a die on a front side of the substrate. The film may be deposited to a thickness of between about 40 nanometers and about 120 nanometers. In certain embodiments, the film may be deposited to an edge of the substrate.

A layer of different or varying thicknesses may be formed on the backside of the substrate using standard patterning techniques known in the art. Therefore, when annealing the film layer different stresses may be created. For example, in some embodiments, a blanket film layer may be deposited on the backside of the substrate, and a mask may be used to selectively deposit additional film in desired locations. The stress in the blanket film and the additional film may be selected and applied by adjusting processing conditions.

For example, an amorphous carbon layer may be deposited on the backside of the substrate. A silicon oxide layer may be deposited on the amorphous carbon layer. The silicon oxide layer may be patterned to form a mask, and then a second amorphous carbon layer may be deposited over the substrate. The substrate may be planarized on the back side to expose the silicon oxide mask, which may then be removed to leave an amorphous carbon layer having selectively varying thickness.

At operation 120, the backside of the substrate is annealed. The annealing changes the structure of the back side film and adjusts strains in the film according to any desired pattern. For example, annealing may relax strains in the film as deposited. The film may be selectively locally annealed to produce correcting strains on the backside of the substrate which compensate for undesirable strains on a front side of the substrate. The film may also be blanket annealed in one step, in some embodiments, to adjust strains selectively added to the film during deposition. The correcting strains are produced in one embodiment by applying designed film layers to the backside of the substrate. The correcting strains are produced in another embodiment via the utilization of film layers already present from a previous processing.

In some embodiments, the annealing is spot annealing. The spot annealing occurs on select locations of the backside of the substrate. The annealing operation may utilize various types of energy. In some embodiments, the annealing is a nanosecond annealing process. In other embodiments, the annealing is a millisecond annealing process.

The annealing results in a change to the desired layer on the backside of the substrate that may be used to relieve stresses and/or strains in the layer as deposited. Selectively relieving the stress and/or strain may create a pattern of stress in the substrate to compensate for structural non-uniformities resulting from the thermal processing. A stress state of the overall substrate may change during the annealing process, so the annealing process may be designed to produce an intermediate stress/strain state of the substrate that is further changed by subsequent processing.

In some embodiments, a plurality of zones may be defined on the backside of the substrate, and each zone may be annealed using different process conditions. For example, a first zone may be annealed via a nanosecond annealing process, and a second zone may be annealed via a millisecond annealing process. In another embodiment, layers of material may be selectively deposited on the backside of the substrate. For example, amorphous carbon may be deposited on a first layer while other layers are coated with silicon dioxide.

At operation 130, the backside of the substrate is implanted. The implant may be completed utilizing any VIISTA® chambers commercially available from Applied Materials, Inc., located in Santa Clara, Calif. Implanting is another way to adjust stress in the back side film by adding dopants. A class of films that may be utilized in the present disclosure includes Advanced Patterning Films (APF) which include amorphous carbons. As such, a doped amorphous carbon may be deposited, a plain amorphous carbon may be deposited, or a plain amorphous carbon may be deposited and subsequently doped. The film may also comprise one of nitrides, metal silicides, or any other material that undergoes a phase change. In some embodiments, the film may be self-absorbing, in that the film dissolves, reacts with, and/or diffuses into the substrate.

The implanted dopant may be selected to adjust stress in the deposited layer. The dopant may be implanted according to a pattern in order to modify stress in specific areas of the film. The stress may be a tensile stress and/or a compressive stress. The dopants may be metals or non-metals. Dopants may include He, Ne, Ar, F, Cl, Br, O, N, P, As, Si, Ge, Sn, B, Al, Ga, In, Zn, Cu, Ag, Au, Ni, Ti, and combinations or alloys thereof.

The implant may be performed by ion beam or plasma. In some embodiments, the implant may be a direct implant. In other embodiments, the implant may be a deposition followed by diffusion. In some cases, a capping layer may be used during a diffusion implant process.

In various embodiments, the backside of the substrate is etched. An etch chamber, described infra, may etch the backside of the substrate. The etch process may proceed according to a desired pattern, using a mask or other pattern feature, to affect stress throughout the substrate by applying a patterned stress differential to the backside of the substrate. The etch process may also be a blanket removal of material from the backside of the substrate to apply a blanket stress differential to the backside of the substrate. A blanket stress differential may be effective to change the overall local stress in one part of the substrate more than in another part of the substrate, which may be useful for some embodiments.

In various embodiments, patterns of stress may be formed on the backside of the substrate to compensate for strains on a front side of the substrate. In some embodiments, a film layer may be deposited on the backside of the substrate, wherein the film layer, such as an amorphous carbon, maintains a certain as deposited stress, either compressive or tensile. The film layer deposited may be annealed in selective locations to relieve the stress.

In another embodiment, amorphous carbon may be deposited on the backside of the substrate and selectively implanted. Subsequently, the substrate may be annealed to form a pattern which creates differing stress matrices, thus creating patterns of stress on the backside of the substrate.

In another embodiment, a film layer having different thicknesses may be deposited on the backside of the substrate. The substrate may be subsequently annealed according to a pattern, thus creating patterns of stress on the backside of the substrate.

In another embodiment, the backside of the substrate may be etched for selective removal of the film layers, thus creating differing thicknesses and patterns of stress on the backside of the substrate.

The method 100 may also include additional operations for treating the backside of the substrate to compensate for strains on the front side of the substrate. In one embodiment, the method 100 may include the local densification of the films on the backside of the substrate. Local densification may include locally annealing or heating the substrate in a specific area to achieve a thickness reduction in the film. The densification may result in an increasing refractive index. The densification of the substrate upon high temperature annealing may also impact the electrical properties of the substrate. Annealing may further result in film densification which may be prominent above the crystallization temperature. Any change in the film properties after a high temperature annealing process may be independent of the deposition technique.

In another embodiment, the method 100 may also include the localized etching of stressed films and/or the performance of a localized reaction between the film and the backside of the substrate. The operation of performing the localized reaction between the film and the substrate may create a solid product of density, thermal expansion coefficient, or other property which is different than the substrate. Furthermore, a metal film may be deposited on the substrate at a temperature which makes the metal film compress. After the depositing, metals, such as a metal silicide material, may be subsequently deposited on the backside of the substrate. In some embodiments, a silicon nitride material may be deposited on the substrate. Oxygen and/or nitrogen may further be added to the backside of the substrate, followed by a local heating, a local implanting, and/or a local annealing operation. In another embodiment, after providing an oxide to the backside of the substrate, an ALD operation may be performed thereon to form a ceramic layer.

In another embodiment, the method 100 may also include the localized deposition of films which have a different CTE than the substrate. In order to take advantage of the CTE difference, the difference in stress between the surface of the substrate may be measured and/or controlled via the temperature at which the depositions are made. For example, depositions made at low temperatures, such as approximately 300 degrees Celsius, may be subsequently relaxed to 100 degrees Celsius. The different CTE of the film and the substrate results in different thermal expansions and contractions between the film or films and the substrate, which may create stresses in the substrate and/or the films across the interface between the substrate and the films.

In another embodiment, the method 100 may also include performing a localized reaction between the film and the substrate, thus creating a solid product having a density different than a density of the substrate. In some embodiments, a metal film may be deposited on the backside of the substrate at a temperature which places a compressive or tensile force upon the metal film. Subsequently oxygen and/or nitrogen may be added to the backside of the substrate, and, in some embodiments, an additional metal material may be added thereon. Furthermore, in some embodiments, the backside of the substrate may be locally heated, locally implanted, and/or annealed.

In another embodiment, the method 100 may also include the localized etching of the backside of the substrate to alter the geometry affecting the stresses thereon. The localized etching may create increase or decrease a thickness of the matter disposed on the backside of the substrate, thus increasing or decreasing the stress on the substrate.

In another embodiment, the method 100 may also include annealing the backside of the substrate to change the crystal structure, crystal orientation, and/or degree of crystallinity. In some embodiments, and by way of example only, if the crystal structure and/or orientation comprises non-isotropic crystals, the crystal orientation may be altered by heating the substrate in a strong electromagnetic field.

The method 100 may further include aligning the substrate for patterning, locating distortions in the substrate, and compensating for the distortions by flattening the substrate. In some embodiments, the substrate may be flattened through the use of an electrostatic chuck, a Bernoulli chuck, or a vacuum chuck.

Finally, the notion of depositing as described above should be understood to include film formations on the backside of the substrate wherein the backside of the substrate obtains a different composition via, by way of example only, surface reactions with gases like nitridation and/or oxidation, and/or surface implantation, among other techniques.

Figure 2:
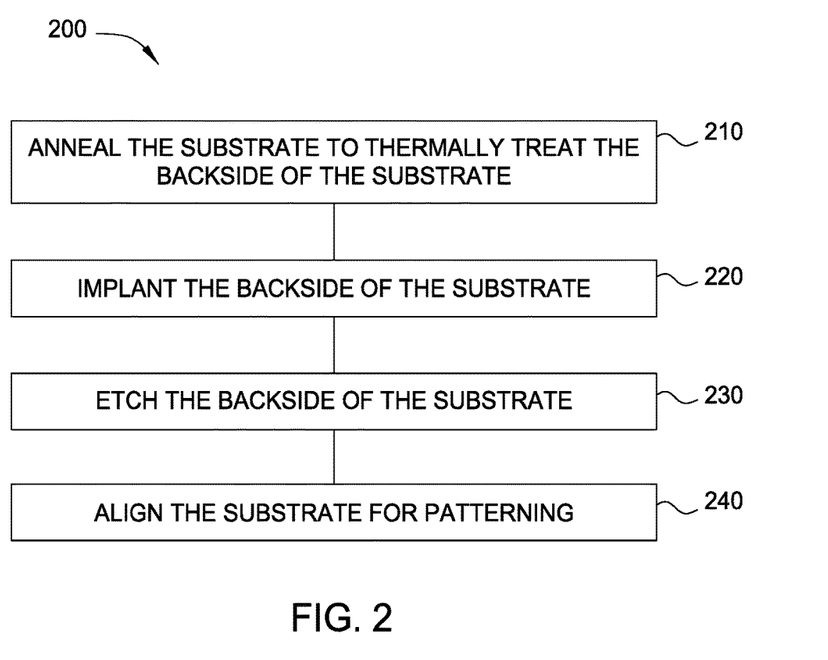
FIG. 2 schematically illustrates operations of a method for treating a backside of a substrate, according to one embodiment.

FIG. 2 illustrates operations of a method 200 for treating a backside of a substrate to compensate for strains on the front side of the substrate.

At operation 210, the backside of the substrate is annealed. The annealing changes the structure of the back side film and adjusts strains in the film according to any desired pattern. For example, annealing may relax strains in the film as deposited. The film may be selectively locally annealed to produce correcting strains on the backside of the substrate which compensate for undesirable strains on a front side of the substrate. The film may also be blanket annealed in one step, in some embodiments, to adjust strains selectively added to the film during deposition. The correcting strains are produced in one embodiment by applying designed film layers to the backside of the substrate. The correcting strains are produced in another embodiment via the utilization of film layers already present from a previous processing.

In some embodiments, the annealing is spot annealing. The spot annealing occurs on select locations of the backside of the substrate. The annealing operation may utilize various types of energy. In some embodiments, the annealing is a nanosecond annealing process. In other embodiments, the annealing is a millisecond annealing process.

The annealing results in a change to the desired layer on the backside of the substrate that may be used to relieve stresses and/or strains in the layer as deposited, apply a desired stress differential to the backside of the substrate, and/or change a stress profile of the substrate. Selectively relieving the stress and/or strain may create a pattern of stress in the substrate to compensate for structural non-uniformities resulting from the thermal processing. A stress state of the overall substrate may change during the annealing process, so the annealing process may be designed to produce an intermediate stress/strain state of the substrate that is further changed by subsequent processing.

In some embodiments, a plurality of zones may be defined on the backside of the substrate, and each zone may be annealed using different process conditions. For example, a first zone may be annealed via a nanosecond annealing process, and a second zone may be annealed via a millisecond annealing process. In another embodiment, layers of material may be selectively deposited on the backside of the substrate. For example, amorphous carbon may be deposited on a first layer while other layers are coated with silicon dioxide.

At operation 220 the backside of the substrate is implanted. The implant may be completed utilizing any VIISTA® chambers commercially available from Applied Materials, Inc., located in Santa Clara, Calif. Implanting is another way to adjust stress in the back side film by adding dopants. A class of films that may be utilized in the present disclosure includes Advanced Patterning Films (APF) which include amorphous carbons. As such, a doped amorphous carbon may be deposited, a plain amorphous carbon may be deposited, or a plain amorphous carbon may be deposited and subsequently doped. The film may also comprise one of nitrides, metal silicides, or any other material that undergoes a phase change. In some embodiments, the film may be self-absorbing.

The implanted dopant may be selected to adjust stress in the deposited layer. The dopant may be implanted according to a pattern in order to modify stress in specific areas of the film. The stress may be a tensile stress and/or a compressive stress. The dopants may be metals or non-metals. Dopants may include He, Ne, Ar, F, Cl, Br, O, N, P, As, Si, Ge, Sn, B, Al, Ga, In, Zn, Cu, Ag, Au, Ni, Ti, and combinations or alloys thereof.

The implant may be performed by ion beam or plasma. In some embodiments, the implant may be a direct implant. In other embodiments, the implant may be a deposition followed by diffusion. In some cases, a capping layer may be used during a diffusion implant process.

At operation 230, the backside of the substrate is etched. An etch chamber, described infra, may etch the backside of the substrate. At operation 240, the substrate is aligned for patterning.

In some embodiments, the method 200 may further include depositing a film on the backside of the substrate. A class of film may be used to advance patterning for lithography. As such, the film comprises one of nitrides, amorphous carbons, diamond-like carbons, metals, metal silicides, or any other material that undergoes a phase change. In some embodiments, the film may be a metal with a stress/strain alteration arising from the formation of varying amounts of metal silicide. In some embodiments, the film is self-absorbing. An area of the film is deposited to a corresponding area of the substrate. In certain embodiments, the area of the film corresponds to a die on a front side of the substrate. The film is deposited to a standard depth of between about 40 nanometers and about 120 nanometers.

In other embodiments, the method 200 further includes locating distortions in the substrate, and compensating for the distortions by flattening the substrate. In some embodiments, the substrate may be flattened through the use of an electrostatic chuck, a Bernoulli chuck, or a vacuum chuck.

The method 200 may also include additional operations for treating the backside of the substrate to compensate for strains on the front side of the substrate. In one embodiment, the method 100 may include the local densification of the films on the backside of the substrate. Local densification may include locally annealing or heating the substrate in a specific area to achieve a thickness reduction in the film. The densification may result in an increasing refractive index. The densification of the substrate upon high temperature annealing may also impact the electrical properties of the substrate. Annealing may further result in film densification which may be prominent above the crystallization temperature. Any change in the film properties after a high temperature annealing process may be independent of the deposition technique.

In another embodiment, the method 200 may also include the localized etching of stressed films and/or the performance of a localized reaction between the film and the backside of the substrate. The operation of performing the localized reaction between the film and the substrate may create a solid product of density, thermal expansion coefficient, or other property which is different than the substrate. Furthermore, a metal film may be deposited on the substrate at a temperature which makes the metal film compress. After the depositing, metals, such as a metal silicide material, may be subsequently deposited on the backside of the substrate. In some embodiments, a silicon nitride material may be deposited on the substrate. Oxygen and/or nitrogen may further be added to the backside of the substrate, followed by a local heating, a local implanting, and/or a local annealing operation. In another embodiment, after providing an oxide to the backside of the substrate, an ALD operation may be performed thereon to form a ceramic layer.

In another embodiment, the method 200 may also include the localized deposition of films which have a different CTE than the substrate. In order to take advantage of the CTE difference, the difference in stress between the surface of the substrate may be measured and/or controlled via the temperature at which the depositions are made. For example, depositions made at low temperatures, such as approximately 300 degrees Celsius, may be subsequently relaxed to 100 degrees Celsius. The different CTE of the film and the substrate results in different thermal expansions and contractions between the film or films and the substrate, which may create stresses in the substrate and/or the films across the interface between the substrate and the films.

In another embodiment, the method 200 may also include performing a localized reaction between the film and the substrate, thus creating a solid product having a density different than a density of the substrate. In some embodiments, a metal film may be deposited on the backside of the substrate at a temperature which places a compressive or tensile force upon the metal film. Subsequently oxygen and/or nitrogen may be added to the backside of the substrate, and, in some embodiments, an additional metal material may be added thereon. Furthermore, in some embodiments, the backside of the substrate may be locally heated, locally implanted, and/or annealed.

In another embodiment, the method 200 may also include the localized etching of the backside of the substrate to alter the geometry affecting the stresses thereon. The localized etching may create increase or decrease a thickness of the matter disposed on the backside of the substrate, thus increasing or decreasing the stress on the substrate.

In another embodiment, the method 200 may also include annealing the backside of the substrate to change the crystal structure, crystal orientation, and/or degree of crystallinity. In some embodiments, and by way of example only, if the crystal structure and/or orientation comprises non-isotropic crystals, the crystal orientation may be altered by heating the substrate in a strong electromagnetic field.

Finally, the notion of depositing as described above should be understood to include film formations on the backside of the substrate wherein the backside of the substrate obtains a different composition via, by way of example only, surface reactions with gases like nitridation and/or oxidation, and/or surface implantation, among other techniques.

Figure 3:
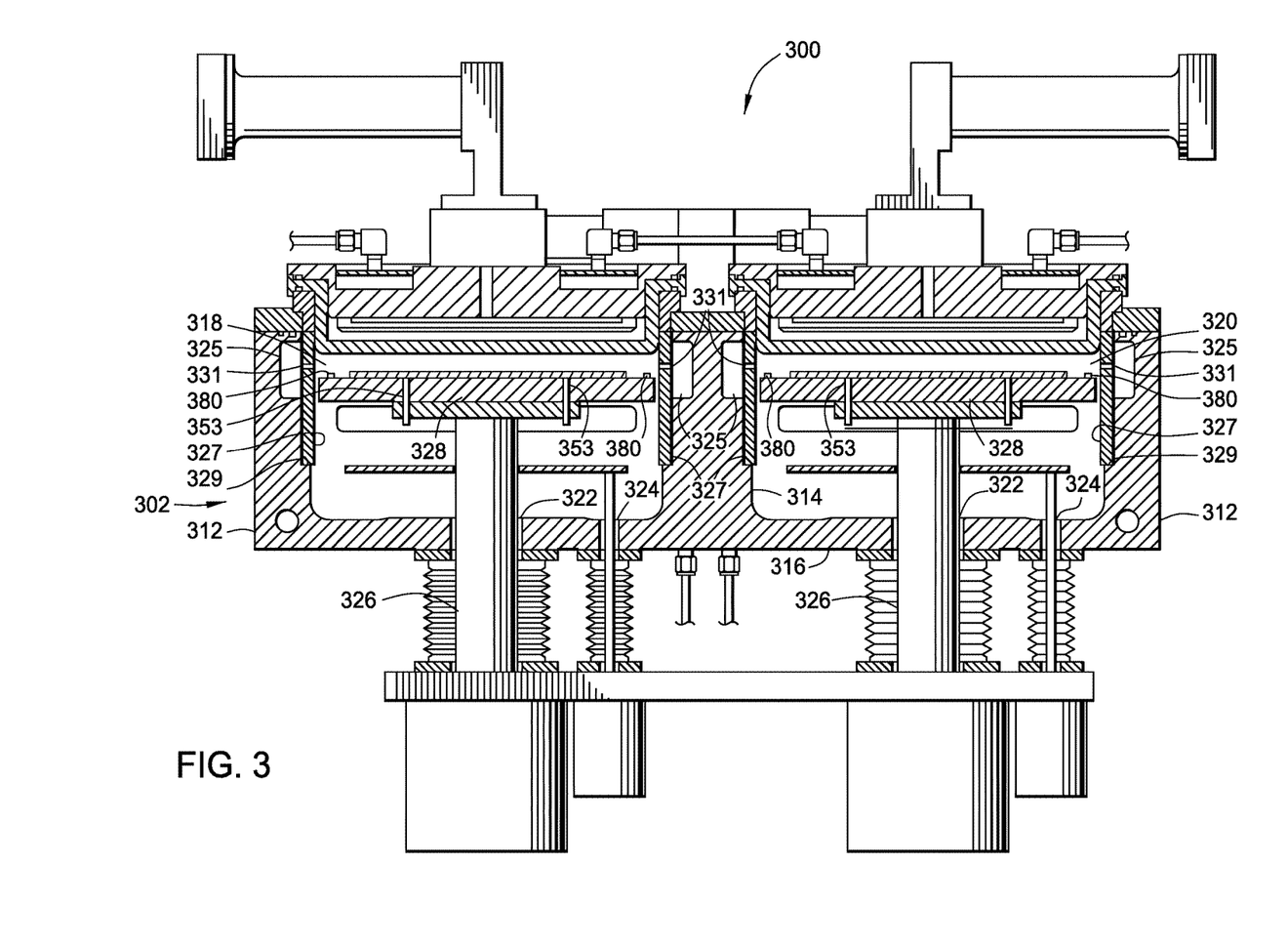
FIG. 3 illustrates a schematic diagram of a deposition chamber, according to one embodiment.

FIG. 3 illustrates an apparatus for processing substrates. The apparatus of FIG. 3 may be a plasma deposition chamber for depositing a film on the backside of the substrate, as described supra.

FIG. 3 shows a schematic cross-sectional view of a chamber 300 defining two processing regions 318, 320. Chamber body 302 includes sidewall 312, interior wall 314, and bottom wall 316 which define two processing regions 318, 320. The bottom wall 316 in each processing region 318, 320 defines at least two passages 322, 324 through which a stem 326 of a pedestal heater 328 and a rod 330 of a substrate lift pin assembly are disposed, respectively.

The sidewall 312 and the interior wall 314 define two cylindrical annular processing regions 318, 320. A circumferential pumping channel 325 is formed in the chamber walls defining the cylindrical processing regions 318, 320 for exhausting gases from the processing regions 318, 320 and controlling the pressure within each region 318, 320. A chamber liner or insert 327, preferably made of ceramic or the like, is disposed in each processing region 318, 320 to define the lateral boundary of each processing region and to protect the chamber walls 312, 314 from the corrosive processing environment and to maintain an electrically isolated plasma environment between the electrodes. The liner 327 is supported in the chamber on a ledge 329 formed in the walls 312, 314 of each processing region 318, 320. The liner includes a plurality of exhaust ports 331, or circumferential slots, disposed therethrough and in communication with the pumping channel 325 formed in the chamber walls. In one embodiment, there are about twenty four ports 331 disposed through each line 327 which are spaces apart by about 15 degrees and located about the periphery of the processing regions 318, 320. While twenty four ports disclosed, any number can be employed to achieve the desired pumping rate and uniformity. In addition to the number of ports, the height of the ports relative to the face plate of the gas distribution system is controlled to provide an optimal gas flow pattern over the substrate during processing.

In some embodiments, the chamber 300 comprises a substrate edge support 380. The substrate edge support 380 may be a continuous or discontinuous wall or a plurality of posts for supporting an edge portion of a substrate above the pedestal heater 328. In some embodiments, the substrate edge support 380 may prevent direct contact between the device side of a substrate and the pedestal heater 328 to allow for deposition of a layer on the backside of the substrate.

As described supra, in some embodiments an edge support 380 may be utilized for supporting an edge portion of the substrate above a pedestal heater. However, in some embodiments, the substrate may be supported by a plurality of pins. The plurality of pins may contact the substrate at any location on the substrate, including at a location near the edge of the substrate. Pin support may allow for flash heating of the bottom stress film side of the substrate. Furthermore, in some embodiments, a backside of the substrate may be laser annealed or heated with the substrate resting and/or supported on an edge of the substrate.

Figure 4:
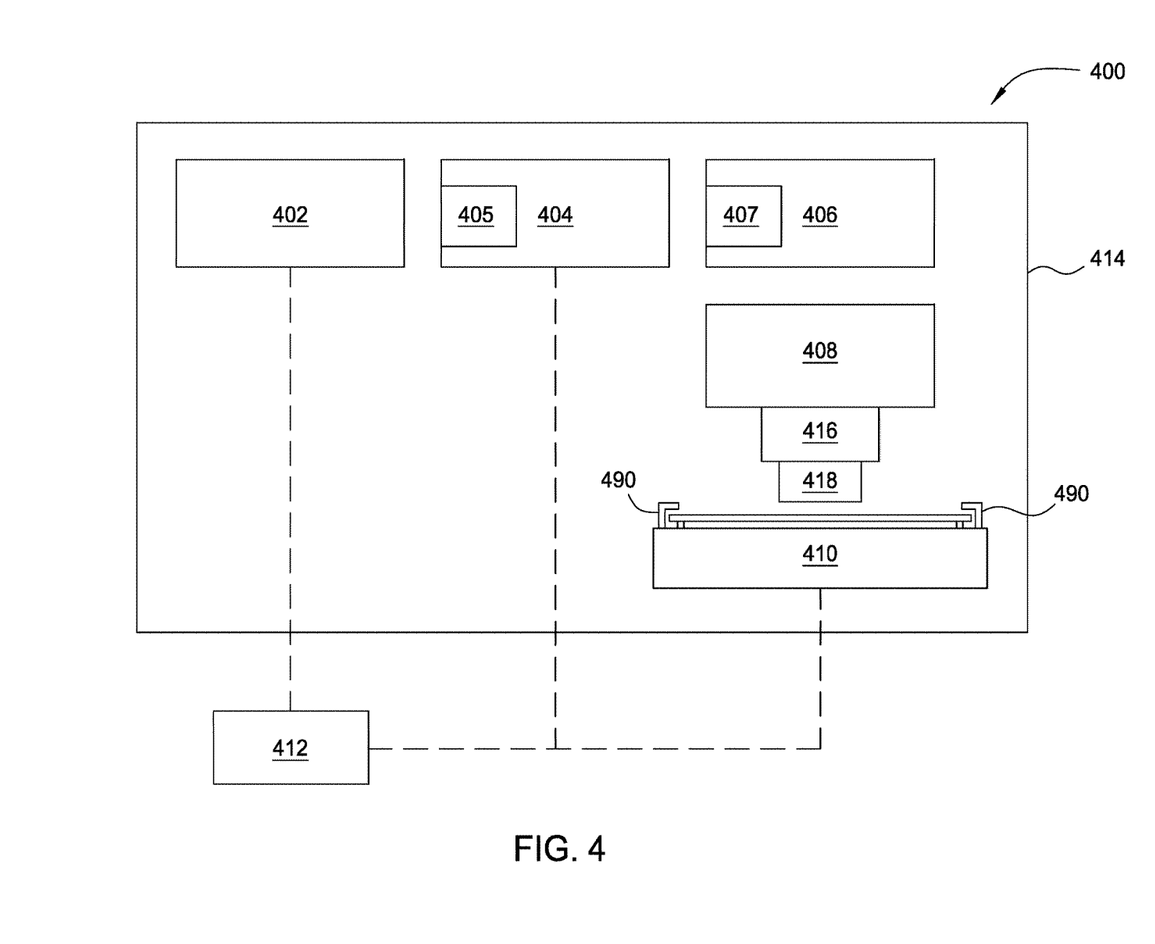
FIG. 4 illustrates a schematic isometric view of an apparatus for thermally processing a substrate, according to one embodiment.

FIG. 4 is a plan view of a system 400 for thermally processing a substrate. The system 400 may be utilized to apply pulsed laser radiation to substrates, as described supra. Specifically, the system 400 may be utilized in a nanosecond annealing process. Furthermore, the system 400 may be utilized for annealing the backside of the substrate, as described supra.

The system 400 comprises an energy module 402 that has a plurality of pulsed laser sources producing a plurality of pulsed laser pulses, a pulse control module 404 that combines individual pulsed laser pulses into combination pulsed laser pulses, and that controls intensity, frequency characteristics, and polarity characteristics of the combination pulsed laser pulses, a pulse shaping module 406 that adjusts the temporal profile of the pulses of the combined pulsed laser pulses, a homogenizer 408 that adjusts the spatial energy distribution of the pulses, overlapping the combination pulsed laser pulses into a single uniform energy field, an aperture member 416 that removes residual edge non-uniformity from the energy field, and an alignment module 418 that allows precision alignment of the laser energy field with a substrate disposed on a substrate support 410. A controller 412 is coupled to the energy module 402 to control production of the laser pulses, the pulse control module 404 to control pulse characteristics, and the substrate support 410 to control movement of the substrate with respect to the energy field. An enclosure 414 typically encloses the operative components of the system 400. In some embodiments, the system 400 further comprises a shadow ring 490 for shielding an edge of the substrate from high thermal stresses.

The substrate support 410 may feature an edge support substantially similar to the edge support 380 described above in connection with FIG. 3, for a similar purpose. As the stage is moved to position the substrate for processing specific target zones, unwanted movement of the substrate on the edge support may be minimized by adopting a suitably small spacing between the substrate edge and the shadow ring 490. For example, if the substrate is a 300 mm substrate, the shadow ring 490 may have an internal radius of 150.2 mm or less.

As described supra, in some embodiments an edge support may be utilized for supporting an edge portion of the substrate. However, in some embodiments, the substrate may be supported by a plurality of pins. The plurality of pins may contact the substrate at any location on the substrate, including at a location near the edge of the substrate. Pin support may allow for pulsed laser processing of the bottom stress film side of the substrate. Furthermore, in some embodiments, a backside of the substrate may be laser processed or heated with the substrate resting and/or supported on an edge of the substrate.

The lasers may be any type of laser capable of forming short pulses, for example duration less than about 100 nsec., of high power laser radiation. Typically, high modality lasers having over 500 spatial modes with $M^2$ greater than about 30 are used. Solid state lasers such as Nd:YAG, Nd:glass, titanium-sapphire, or other rare earth doped crystal lasers are frequently used, but gas lasers such as excimer lasers, for example $XeCl_2$, ArF, or KrF lasers, may be used. The lasers may be switched, for example by q-switching (passive or active), gain switching, or mode locking. A Pockels cell may also be used proximate the output of a laser to form pulses by interrupting a beam emitted by the laser. In general, lasers usable for pulsed laser processing are capable of producing pulses of laser radiation having energy content between about 100 mJ and about 10 J with duration between about 1 nsec and about 100 μsec, typically about 1 J in about 8 nsec. The lasers may have wavelength between about 200 nm and about 2,000 nm, such as between about 400 nm and about 1,000 nm, for example about 532 nm. In one embodiment, the lasers are q-switched frequency-doubled Nd:YAG lasers. The lasers may all operate at the same wavelength, or one or more of the lasers may operate at different wavelengths from the other lasers in the energy module 402. The lasers may be amplified to develop the power levels desired. In most cases, the amplification medium will be the same or similar composition to the lasing medium. Each individual laser pulse is usually amplified by itself, but in some embodiments, all laser pulses may be amplified after combining.

A typical laser pulse delivered to a substrate is a combination of multiple laser pulses. The multiple pulses are generated at controlled times and in controlled relationship to each other such that, when combined, a single pulse of laser radiation results that has a controlled temporal and spatial energy profile, with a controlled energy rise, duration, and decay, and a controlled spatial distribution of energy non-uniformity. The controller 412 may have a pulse generator, for example an electronic timer coupled to a voltage source, that is coupled to each laser, for example each switch of each laser, to control generation of pulses from each laser.

The plurality of lasers are arranged so that each laser produces pulses that emerge into the pulse control module 404, which may have one or more pulse controllers 405. One or more pulses exit the pulse control module 404 and enter the pulse shaping module 406, which has one or more pulse shapers 407.

In some embodiments, the laser radiation may be directed from below the substrate support 410 toward the substrate, which is resting device-side-up on the edge support. A window or opening in the substrate support 410 may be provided to admit laser radiation from below the substrate support 410 toward the backside of the substrate.

Figure 5:
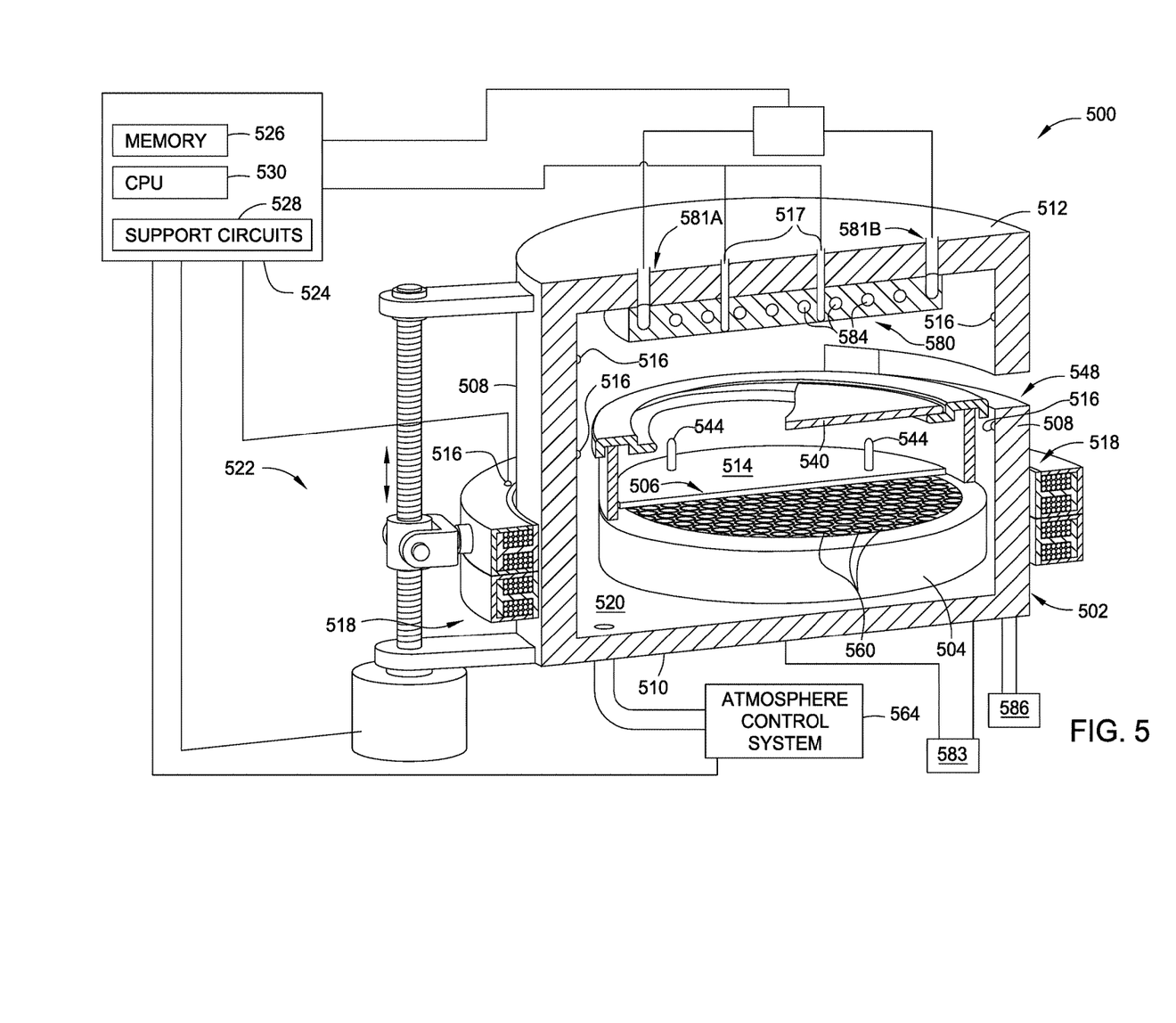
FIG. 5 illustrates a schematic isometric view of a rapid thermal processing chamber for thermally processing a substrate, according to one embodiment.

FIG. 5 is a schematic diagram of a system 500 for thermally processing a substrate. The system 500 may be utilized to anneal, via lamp annealing, and/or chemically flash anneal substrates, as described supra. Furthermore, the system 500 may be utilized for annealing the backside of the substrate, as described supra.

FIG. 5 is a simplified isometric view of one embodiment of a rapid thermal processing (RTP) chamber 500. An example of a rapid thermal processing chamber that may be adapted to benefit from the disclosure is the VULCAN® chamber, commercially available from Applied Materials, Inc., located in Santa Clara, Calif. The processing chamber 500 includes a contactless or magnetically levitated substrate support 504, a chamber body 502, having walls 508, a bottom 510, and a top 512 defining an interior volume 520. The walls 508 typically include at least one substrate access port 548 to facilitate entry and egress of a substrate 540 (a portion of which is shown in FIG. 5). The access port may be coupled to a transfer chamber (not shown) or a load lock chamber (not shown) and may be selectively sealed with a valve, such as a slit valve (not shown). In one embodiment, the substrate support 504 is annular and the chamber 500 includes a radiant heat source 506 disposed in an inside diameter of the substrate support 504.

The substrate support 504 is adapted to magnetically levitate and rotate within the interior volume 520. The substrate support 504 is capable of rotating while raising and lowering vertically during processing, and may also be raised or lowered without rotation before, during, or after processing. This magnetic levitation and/or magnetic rotation prevents or minimizes particle generation due to the absence or reduction of moving parts typically used to raise/lower and/or rotate the substrate support.

The chamber 500 also includes a window 514 made from a material transparent to heat and light of various wavelengths, which may include light in the infra-red (IR) spectrum, through which photons from the radiant heat source 506 may heat the substrate 540. The window 514 may include a plurality of lift pins 544 coupled to an upper surface of the window 514, which are adapted to selectively contact and support the substrate 540, to facilitate transfer of the substrate into and out of the chamber 500.

In one embodiment, the radiant heat source 506 includes a lamp assembly formed from a housing which includes a plurality of honeycomb tubes 560 in a coolant assembly (not shown) coupled to a coolant source 583. The coolant source 583 may be one or a combination of water, ethylene glycol, nitrogen ($N_2$), and helium (He). The housing may be made of a copper material or other suitable material having suitable coolant channels formed therein for flow of the coolant from the coolant source 583. Each tube 560 may contain a reflector and a high-intensity lamp assembly or an IR emitter from which is formed a honeycomb-like pipe arrangement. Dynamic control of the heating of the substrate 540 may be effected by the one or more temperature sensors 517 (described in more detail below) adapted to measure the temperature across the substrate 540.

A stator assembly 518 circumscribes the walls 508 of the chamber body 502 and is coupled to one or more actuator assemblies 522 that control the elevation of the stator assembly 518 along the exterior of the chamber body 502.

An atmosphere control system 564 is also coupled to the interior volume 520 of the chamber body 502. The atmosphere control system 564 generally includes throttle valves and vacuum pumps for controlling chamber pressure. The atmosphere control system 564 may additionally include gas sources for providing process or other gases to the interior volume 520. The atmosphere control system 564 may also be adapted to deliver process gases for thermal deposition processes.

The chamber 500 also includes a controller 524, which generally includes a central processing unit (CPU) 530, support circuits 528 and memory 526. The CPU 530 may be one of any form of computer processor that can be used in an industrial setting for controlling various actions and sub-processors. The memory 526, or computer-readable medium, may be one or more of readily available memory such as random access memory (RAM), read only memory (ROM), floppy disk, hard disk, or any other form of digital storage, local or remote, and is typically coupled to the CPU 530. The support circuits 528 are coupled to the CPU 530 for supporting the controller 524 in a conventional manner. These circuits include cache, power supplies, clock circuits, input/output circuitry, subsystems, and the like.

The chamber 500 also includes one or more sensors 516, which are generally adapted to detect the elevation of the substrate support 504 (or substrate 540) within the interior volume 520 of the chamber body 502. The sensors 516 may be coupled to the chamber body 502 and/or other portions of the processing chamber 500 and are adapted to provide an output indicative of the distance between the substrate support 504 and the top 512 and/or bottom 510 of the chamber body 502, and may also detect misalignment of the substrate support 504 and/or substrate 540. The one or more sensors 516 are coupled to the controller 524 that receives the output metric from the sensors 516 and provides a signal or signals to the one or more actuator assemblies 522 to raise or lower at least a portion of the substrate support 504. The one or more sensors 516 may be ultrasonic, laser, inductive, capacitive, or other type of sensor capable of detecting the proximity of the substrate support 504 within the chamber body 502.

The chamber 500 also includes one or more temperature sensors 517, which may be adapted to sense temperature of the substrate 540 before, during, and after processing. In the embodiment depicted in FIG. 5, the temperature sensors 517 are disposed through the top 512, although other locations within and around the chamber body 502 may be used.

Figure 6:
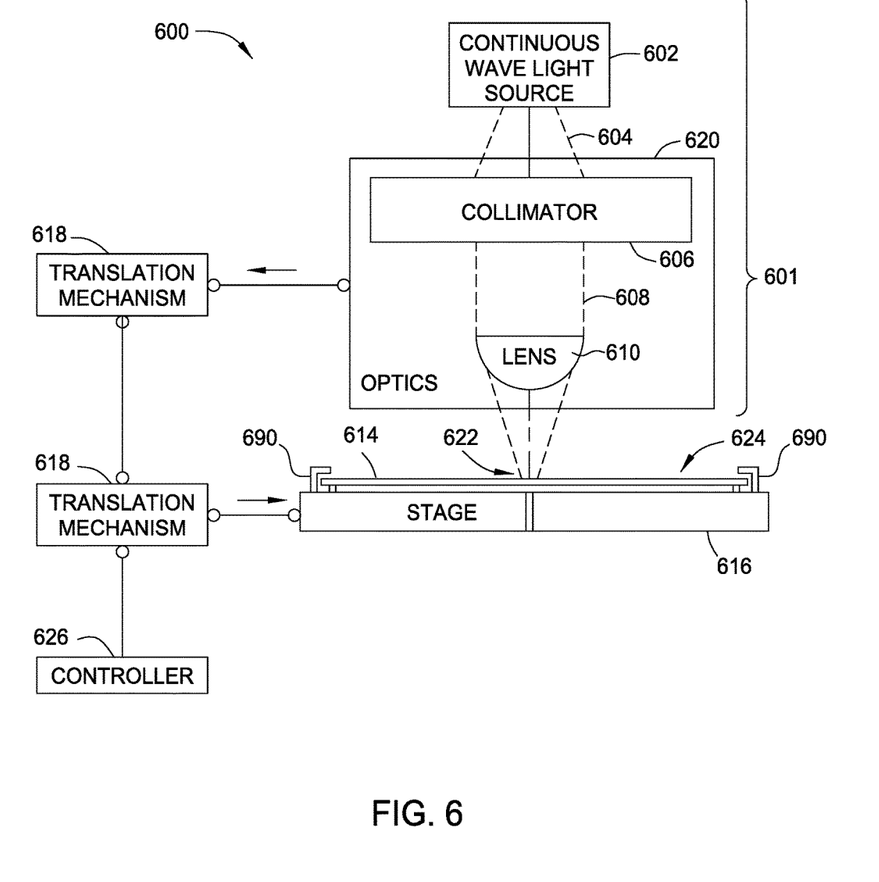
FIG. 6 illustrates a schematic diagram of an apparatus for thermally processing a substrate, according to one embodiment.

FIG. 6 schematically illustrates an apparatus 600 for thermally processing a substrate. Specifically, the apparatus 600 may be utilized in a millisecond annealing process. Furthermore, the system 600 may be utilized for annealing the backside of the substrate, as described supra.

The apparatus 600 comprises a continuous wave electromagnetic radiation module 601, a stage 616 configured to receive a substrate 614 thereon, and a translation mechanism 618. The continuous wave electromagnetic radiation module 601 comprises a continuous wave electromagnetic radiation source 602 and focusing optics 620 disposed between the continuous wave electromagnetic radiation source 602 and the stage 616.

The continuous wave electromagnetic radiation source 602 is capable of emitting "continuous waves" or rays of electromagnetic radiation, such as light. By "continuous wave" it is meant that the radiation source is configured to emit radiation continuously, i.e., not a burst, pulse, or flash of radiation. This is quite unlike lasers used in laser annealing, which typically use a burst or flash of light.

Furthermore, as the continuous wave electromagnetic radiation needs to be absorbed at or near the surface of the substrate, the radiation has a wavelength within the range at which the substrate absorbs radiation. In the case of a silicon substrate, the continuous wave electromagnetic radiation preferably has a wavelength between 190 nm and 950 nm. More preferably, it has a wavelength of approximately 810 nm.

Alternatively, a high power continuous wave electromagnetic radiation laser source operation in or near the UV may be used. Wavelengths produced by such continuous wave electromagnetic radiation laser sources are strongly absorbed by most otherwise reflective materials.

In a preferred embodiment, the continuous wave electromagnetic radiation source 602 is capable of emitting radiation continuously for at least 15 seconds. Also, in a preferred embodiment, the continuous wave electromagnetic radiation source 602 comprises multiple laser diodes, each of which produces uniform and spatially coherent light at the same wavelength. The power of the laser diode(s) is in the range of 0.5 kW to 50 kW, but preferably approximately 5 kW. Suitable laser diodes are made by Coherent Inc. of Santa Clara, Calif. Spectra-Physics of California; or by Cutting Edge Optronics, Inc. of St. Charles, Mo. A preferred laser diode is made by Cutting Edge Optronics, although another suitable laser diode is Spectra Physics' MONSOON® multi-bar module (MBM), which provides 40-480 watts of continuous wave power per laser diode module.

The focusing optics 620 preferably comprise one or more collimators 606 to collimate radiation 604 from the continuous wave electromagnetic radiation source 602 into a substantially parallel beam 608. This collimated radiation 608 is then focused by at least one lens 610 into a line of radiation 622 at an upper surface 624 of the substrate 614.

Lens 610 is any suitable lens, or series of lenses, capable of focusing radiation into a line. In a preferred embodiment, lens 610 is a cylindrical lens. Alternatively, lens 610 may be one or more concave lenses, convex lenses, plane mirrors, concave mirrors, convex mirrors, refractive lenses, diffractive lenses, Fresnel lenses, gradient index lenses, or the like.

The stage 616 may include a platform for translating the substrate, as explained below. The stage 616 may include an edge support similar to the edge support 390 of FIG. 3 for backside processing of the substrate.

As described supra, in some embodiments an edge support may be utilized for supporting an edge portion of the substrate. However, in some embodiments, the substrate may be supported by a plurality of pins. The plurality of pins may contact the substrate at any location on the substrate, including at a location near the edge of the substrate. Pin support may allow for thermal processing of the bottom stress film side of the substrate. Furthermore, in some embodiments, a backside of the substrate may be thermally processed with the substrate resting and/or supported on an edge of the substrate.

The apparatus 600 also comprises a translation mechanism 618 configured to translate the stage 616 and the line of radiation 622 relative to one another. In one embodiment, the translation mechanism 618 is coupled to the stage 616 to move the stage 616 relative to the continuous wave electromagnetic radiation source 602 and/or the focusing optics 620. In another embodiment, the translation mechanism is coupled to both the continuous wave electromagnetic radiation source 602 and the focusing optics 620 to move the continuous wave electromagnetic radiation source 602 and/or the focusing optics 620 relative to the stage 616. In yet another embodiment, the translation mechanism 618 moves the continuous wave electromagnetic radiation source 602, the focusing optics 620, and the stage 616. Any suitable translation mechanism may be used, such as a conveyor system, rack and pinion system, or the like.

In certain embodiments, the apparatus 600 comprises a shadow ring 690 for shielding an edge of the substrate 614 from high thermal stresses. As noted above, the shadow ring 690 may be sized to prevent unwanted movement of the substrate on the stage 616.

Figure 7:
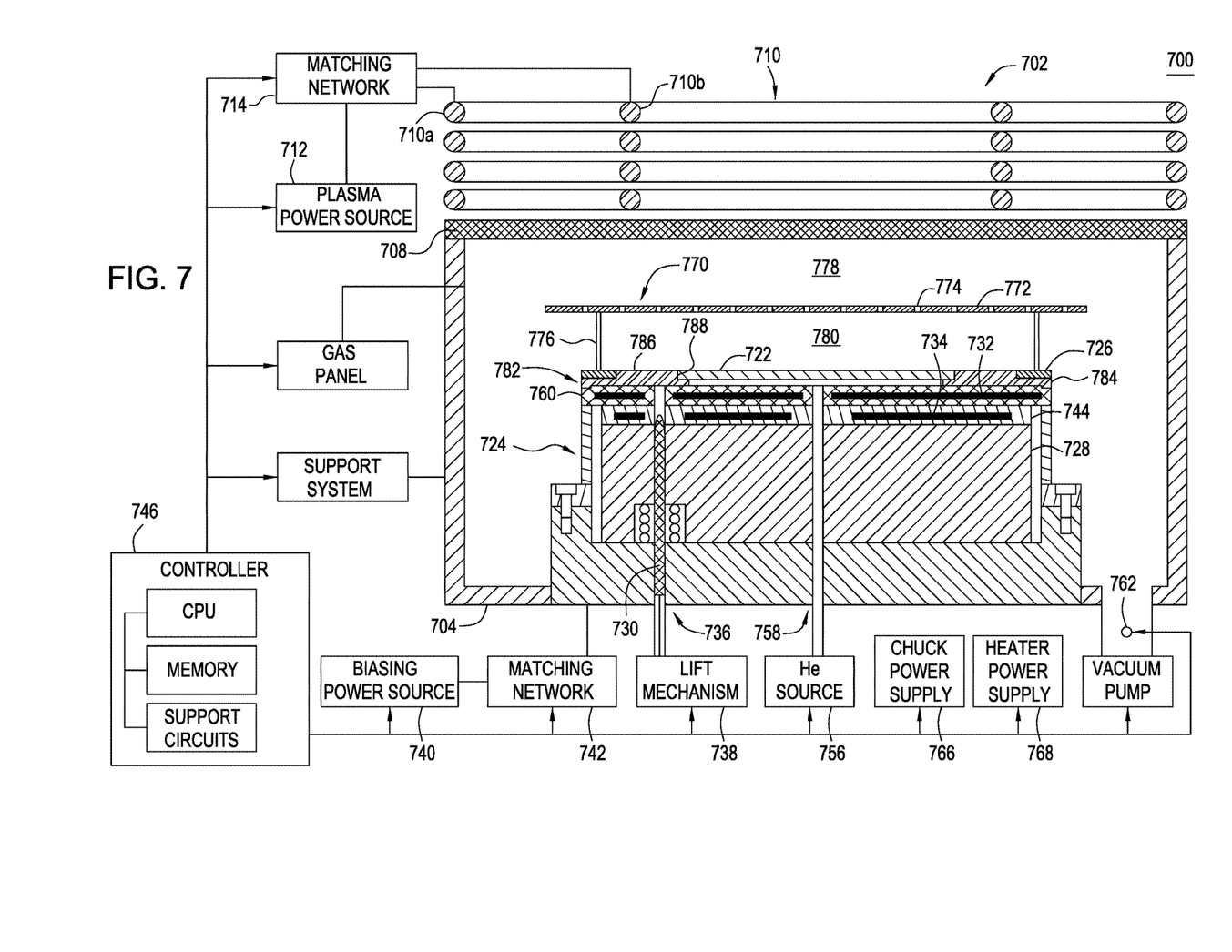
FIG. 7 illustrates a schematic diagram of an etch reactor, according to one embodiment.

FIG. 7 illustrates a schematic diagram of an etch reactor 700. The etch reactor 700 may be utilized to etch the backside of the substrate, as described supra.

In certain embodiments, the etch reactor 700 may include an ion radical shield 770. Suitable reactors that may be adapted for use with the teachings disclosed herein include, for example, the Decoupled Plasma Source (DPS®) II reactor, or the Tetra™ Photomask etch systems, all of which are available from Applied Materials, Inc. of Santa Clara, Calif. The DPS® II reactor may also be used as a processing module of a Centura® integrated semiconductor wafer processing system, also available from Applied Materials, Inc. The particular embodiment of the reactor 700 shown herein is provided for illustrative purposes and should not be used to limit the scope of the disclosure.

The reactor 700 generally comprises a process chamber 702 having a substrate pedestal 724 within a conductive body (wall) 704, and a controller 746. The chamber 702 has a substantially flat dielectric ceiling 708. Other modifications of the chamber 702 may have other types of ceilings, e.g., a dome-shaped ceiling. An antenna 710 is disposed above the ceiling 708. The antenna 710 comprises one or more inductive coil elements that may be selectively controlled (two co-axial elements 710a and 710b are shown in FIG. 7). The antenna 710 is coupled through a first matching network 714 to a plasma power source 712. The plasma power source 712 is typically capable of producing up to about 3000 W at a tunable frequency in a range from about 50 kHz to about 13.56 MHz.

The substrate pedestal (cathode) 724 is coupled through a second matching network 742 to a biasing power source 740. The biasing source 740 generally is a source of up to about 500 W at a frequency of approximately 13.56 MHz that is capable of producing either continuous or pulsed power. Alternatively, the source 740 may be a DC or pulsed DC source.

In one embodiment, the substrate support pedestal 724 provides substrate edge support. In one embodiment, the substrate support pedestal 724 comprises an electrostatic chuck 760. The electrostatic chuck 760 comprises at least one clamping electrode 732 and is controlled by a chuck power supply 766. In alternative embodiments, the substrate pedestal 724 may comprise substrate retention mechanisms such as a susceptor clamp ring, a mechanical chuck, and the like.

A reticle adapter 782 is used to secure the substrate (reticle) 722 onto the substrate support pedestal 724. The reticle adapter 782 generally includes a lower portion 784 milled to cover an upper surface of the pedestal 724 (for example, the electrostatic chuck 760) and a top portion 786 having an opening 788 that is sized and shaped to hold the substrate 722. The opening 788 is generally substantially centered with respect to the pedestal 724. The adapter 782 is generally formed from a single piece of etch resistant, high temperature resistant material such as polyimide ceramic or quartz. A suitable reticle adapter is disclosed in U.S. Pat. No. 6,251,217, issued on Jun. 26, 2001, which is incorporated herein by reference to the extent not inconsistent with aspects and claims of the disclosure. An edge ring 726 may cover and/or secure the adapter 782 to the pedestal 724.

A lift mechanism 738 is used to lower or raise the adapter 782, and hence, the substrate 722, onto or off of the substrate support pedestal 724. Generally, the lift mechanism 762 comprises a plurality of lift pins 730 (one lift pin is shown) that travel through respective guide holes 736.

In operation, the temperature of the substrate 722 is controlled by stabilizing the temperature of the substrate pedestal 724. In one embodiment, the substrate support pedestal 724 comprises a resistive heater 744 and a heat sink 728. The resistive heater 744 generally comprises at least one heating element 734 and is regulated by a heater power supply 768. A backside gas (e.g., helium (He)) from a gas source 756 is provided via a gas conduit 758 to channels that are formed in the pedestal surface under the substrate 722. The backside gas is used to facilitate heat transfer between the pedestal 724 and the substrate 722. During processing, the pedestal 724 may be heated by the embedded resistive heater 744 to a steady-state temperature, which in combination with the helium backside gas, facilitates uniform heating of the substrate 722. Using such thermal control, the substrate 722 may be maintained at a temperature between about 0 and 350 degrees Celsius.

An ion-radical shield 770 is disposed in the chamber 702 above the pedestal 724. The ion-radical shield 770 is electrically isolated from the chamber walls 704 and the pedestal 724 and generally comprises a substantially flat plate 772 and a plurality of legs 776. The plate 772 is supported in the chamber 702 above the pedestal by the legs 776. The plate 772 defines one or more openings (apertures) 774 that define a desired open area in the surface of the plate 772. The open area of the ion-radical shield 770 controls the quantity of ions that pass from a plasma formed in an upper process volume 778 of the process chamber 702 to a lower process volume 780 located between the ion-radical shield 770 and the substrate 722. The greater the open area, the more ions can pass through the ion-radical shield 770. As such, the size of the apertures 774 control the ion density in volume 780. Consequently, the shield 770 is an ion filter.

Figure 8:
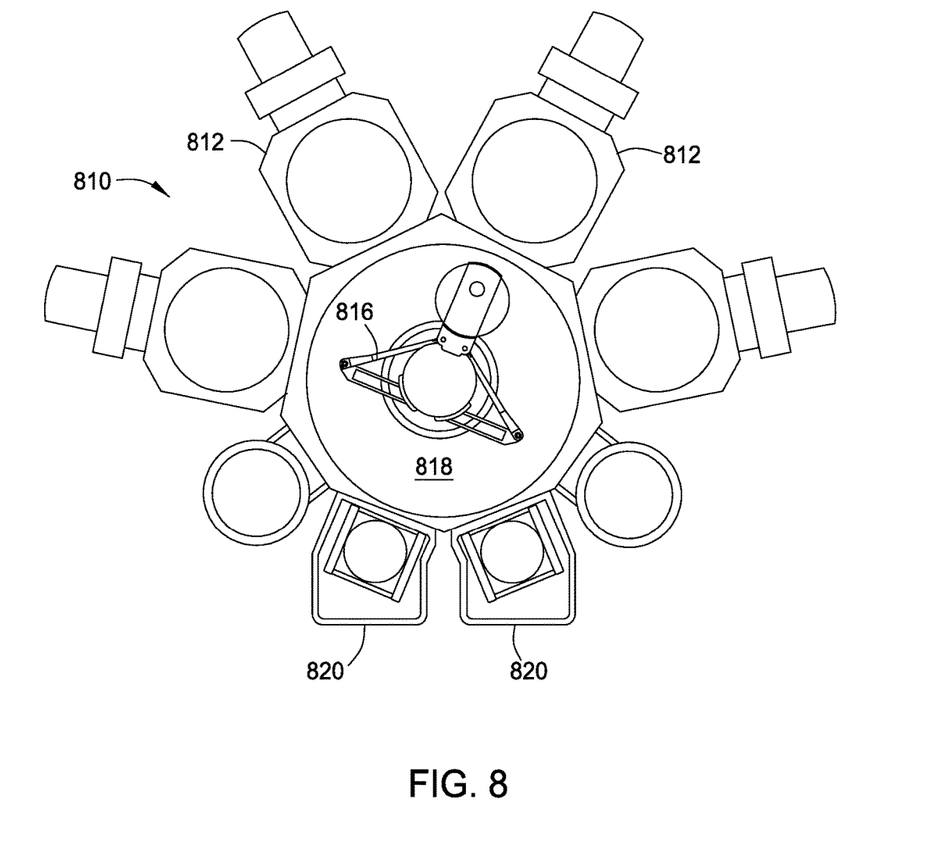
FIG. 8 illustrates a top schematic view of a cluster tool transfer chamber having a plurality of substrate processing chambers, according to one embodiment.

FIG. 8 illustrates a top schematic view of a cluster tool 810 having multiple substrate processing chambers 812 mounted thereon. A cluster tool similar to that shown in FIG. 8 is commercially available from Applied Materials, Inc. of Santa Clara, Calif. The cluster tool 810 may be utilized to as a transfer chamber for transferring a substrate between the various tools and chambers described herein.

The tool includes a loadlock chamber 820 and a transfer chamber 818 having a substrate handling module 816 for moving the substrates from location to location within the system, in particular, between the multiple substrate processing chambers 812. This particular tool is shown to accommodate up to four substrate processing chambers 812 positioned radially about the transfer chamber, however it is contemplated that any number of substrate processing chamber 812 may be accommodated thereon.

Benefits of the present disclosure include processing of the bottom of the substrate is less likely to affect the top structures of the substrate thermally (e.g., via the use of surface heating techniques, high surface irradiance lasers, or flashlamps) or compositionally. Additionally, strains from the bottom of the substrate are more consistent as they are isolated from any processing on the top of the substrate. Furthermore, additional adjustments may be made on the bottom of the substrate to compensate for strains developed in later processing. Once heated, implantation on the backside of the substrate counteracts other thermal stresses on the front side of the substrate.

While the foregoing is directed to embodiments of the present disclosure, other and further embodiments of the disclosure may be devised without departing from the basic scope thereof, and the scope thereof is determined by the claims that follow.

What is claimed is:

1. A substrate processing method, comprising:
   forming device structures on a device side of a substrate comprising a plurality of dies;
   locating distortions in the substrate;
   depositing a metal containing film on a backside of the substrate, wherein the backside of the substrate is opposite the device side;
   after depositing the metal containing film, depositing a metal silicide material on the backside of the substrate;
   after the depositing a metal silicide material, incorporating a dopant into the backside of the substrate;
   etching the backside of the substrate to create strains which compensate for the distortions;
   aligning the substrate for patterning; and
   flattening the substrate.

2. The method of claim 1, wherein the dopant is oxygen.

3. The method of claim 2, further comprising:
   performing an atomic layer deposition process to form a ceramic material layer on the backside of the substrate.

4. The method of claim 1, wherein the dopant is nitrogen.

5. The method of claim 1, wherein the incorporating a dopant further comprises:
   locally implanting the dopant into the backside of the substrate.

6. The method of claim 1, wherein the incorporating a dopant further comprises:
   depositing a dopant containing film on the backside of the substrate and locally annealing the dopant containing film to create strains which compensate for the distortions.

7. The method of claim 1, wherein the depositing a metal containing film and the depositing a metal silicide material are performed at a temperature of less than about 300° C.

8. The method of claim 1, wherein the flattening the substrate further comprises:

flattening distortions on the device side of the substrate by securing the substrate on an electrostatic chuck.

9. The method of claim 1, wherein the flattening the substrate further comprises:
flattening distortions on the device side of the substrate by securing the substrate on a Bernoulli chuck.

10. The method of claim 1, wherein the flattening the substrate further comprises:
flattening distortions on the device side of the substrate by securing the substrate on a vacuum chuck.

11. The method of claim 1, further comprising:
after the incorporating a dopant into the backside of the substrate, depositing a metal material on the backside of the substrate.

12. A substrate processing method, comprising:
forming device structures on a device side of a substrate comprising a plurality of dies;
locating distortions in the substrate;
depositing a metal containing film on a backside of the substrate, wherein the backside of the substrate is opposite the device side;
after depositing the metal containing film, depositing a silicon nitride material on the backside of the substrate;
after the depositing a silicon nitride material, incorporating a dopant into the backside of the substrate;
etching the backside of the substrate;
aligning the substrate for patterning; and
compensating for the distortions by flattening the substrate.

13. The method of claim 12, wherein the dopant is oxygen.

14. The method of claim 13, further comprising:
performing at atomic layer deposition process to form a ceramic material layer on the backside of the substrate.

15. The method of claim 12, wherein the dopant is nitrogen.

16. The method of claim 12, wherein the incorporating a dopant further comprises:
locally implanting the dopant into the backside of the substrate.

17. The method of claim 12, wherein the incorporating a dopant further comprises:
depositing a dopant containing film on the backside of the substrate and locally annealing the dopant containing film.

18. A substrate processing method, comprising:
forming device structures on a device side of a substrate comprising a plurality of dies;
locating distortions in the substrate;
depositing a first metal containing material on a backside of the substrate, wherein the backside of the substrate is opposite the device side;
after depositing the first metal containing material, depositing a second metal containing material on the backside of the substrate;
after the depositing a second metal containing material, incorporating a dopant into the backside of the substrate;
after the depositing a second metal containing material, depositing a third metal containing material on the backside of the substrate;
annealing the backside of the substrate to create strains which compensate for the distortions; and
etching the backside of the substrate to create strains which compensate for the distortions.

19. The method of claim 18, wherein the incorporating a dopant into the backside of the substrate comprises doping oxygen or nitrogen into the backside of the substrate.

20. The method of claim 18, wherein the annealing the backside of the substrate comprises localized laser annealing.

* * * * *